(12) United States Patent
Yoshihisa

(10) Patent No.: US 6,562,704 B2
(45) Date of Patent: May 13, 2003

(54) METHOD FOR MANUFACTURING SEMICONDUCTOR DEVICE, AND SEMICONDUCTOR DEVICE

(75) Inventor: Yasuki Yoshihisa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/071,188

(22) Filed: Feb. 11, 2002

(65) Prior Publication Data

US 2003/0045077 A1 Mar. 6, 2003

(30) Foreign Application Priority Data

Sep. 5, 2001 (JP) ........................................ 2001-268538

(51) Int. Cl.[7] ............................................. H01L 21/425
(52) U.S. Cl. ........................... 438/530; 438/14; 438/17; 438/514; 438/795
(58) Field of Search ............................ 438/530, 14, 17, 438/795, 514

(56) References Cited

U.S. PATENT DOCUMENTS

| 4,467,519 | A | * | 8/1984 | Glang et al. ................. 257/519 |
|---|---|---|---|---|
| 4,536,223 | A | * | 8/1985 | Faith, Jr. ..................... 438/526 |
| 5,436,097 | A | * | 7/1995 | Norishima et al. .......... 355/125 |
| 5,476,799 | A | * | 12/1995 | Sakamoto et al. . 148/DIG. 123 |
| 5,578,504 | A | * | 11/1996 | Mitani et al. ................. 438/17 |
| 5,691,648 | A | * | 11/1997 | Cheng ......................... 324/716 |
| 5,797,114 | A | * | 8/1998 | Roberts et al. .............. 324/525 |
| 5,863,807 | A | * | 1/1999 | Jang et al. .................... 438/14 |
| 5,918,140 | A | * | 6/1999 | Wickboldt et al. ........... 438/535 |
| 6,015,717 | A | * | 1/2000 | Tripsas ......................... 438/16 |
| 6,065,869 | A | * | 5/2000 | Lin et al. ..................... 374/183 |
| 6,087,189 | A | * | 7/2000 | Huang .......................... 438/10 |
| 6,165,876 | A | * | 12/2000 | Yamazaki et al. ........... 438/163 |
| 6,342,440 | B1 | * | 1/2002 | Sasada et al. ................ 438/530 |
| 6,472,232 | B1 | * | 10/2002 | Johnson et al. ............... 438/14 |

OTHER PUBLICATIONS

Hodul, David and Mehta, Sandeep, "Measurement of Dynamic Temperature Uniformity in Rapid Thermal Processing", Solid State Technology, May 1988, pp. 209–211.*
Jaegar, R.C. Introduction to Microelectronic Fabrication, Addison–Wesley, 1988, pp. 66–69.*
Van Zant Peter, Microchip Fabrication, McGraw–Hill, 4th ed. 2000, pp. 428–443.*

* cited by examiner

Primary Examiner—Richard Elms
Assistant Examiner—Michael K. Luhrs
(74) Attorney, Agent, or Firm—McDermott, Will & Emery

(57) ABSTRACT

After introducing an impurity into a polysilicon semiconductor film formed on a substrate, heat treatment is carried out under the conditions not to activate the implanted impurity. The thickness of the polysilicon film and the sheet resistance after introducing the impurity are measured, and the conditions of forming the semiconductor film are adjusted so that the product of the thickness and the sheet resistance is always constant.

1 Claim, 1 Drawing Sheet

METHOD FOR MANUFACTURING SEMICONDUCTOR DEVICE, AND SEMICONDUCTOR DEVICE

BACKGROUND OF THE INVENTION

1. Field of the Invention

The present invention relates to a semiconductor device that uses a polycrystalline semiconductor film such as a polysilicon film.

2. Background Art

Polysilicon film is one of thin-film materials widely used in the processes for manufacturing semiconductor devices. Since polysilicon film with low resistance can be easily formed by doping of impurity, polysilicon can be easily processed to form fine patterns, and polysilicon is thermally stable and provides high freedom for heat treatment, the polysilicon film is used in high-precision resistor elements, electrodes for bipolar transistors, TFTs (thin film transistors), or polysilicon diodes and the like.

In the processes for manufacturing semiconductor devices, provision of constant qualities, that is, provision of semiconductor devices with same characteristics is required. In the case of a semiconductor device with polysilicon film, since the quality of the polysilicon film affects the characteristics of the elements, providing the films with even quality is one of the issues in the manufacturing processes.

However, since the properties of silicon grains varies due to doping of impurities or heat treatment, it is difficult to provide same conditions for the factors that determine the quality of polysilicon film, such as grain diameter of polysilicon and inter-grain states. In particular, when a polysilicon films are formed using a plurality of polysilicon depositing apparatuses, or when a polysilicon depositing apparatus is replaced, properties of the manufactured elements may vary depending on manufacturing apparatuses.

Although it has been known as methods of observing polysilicon grains to observe the structure or to measure grain diameters using a transmission electron microscope or a scanning electron microscope, these methods have difficulties for quantification, and are unsuitable for the process control in mass production.

SUMMARY OF THE INVENTION

The present invention provides a method for manufacturing a semiconductor device. The method includes these processes below. First, a polycrystalline semiconductor film is formed on a semiconductor substrate. Then, the thickness of the polycrystalline semiconductor film is measured. Next, an impurity is introduced in the polycrystalline semiconductor film, and a part of the impurity is activated by heat treatment. After the heat treatment, the sheet resistance of the polycrystalline semiconductor film is measured. Then the conditions of forming the polycrystalline semiconductor film is adjusted so that the product of the film thickness and the sheet resistance becomes a predetermined value.

The present invention also provides the semiconductor device, such as a resistor element, a transistor and a diode. The polycrystalline semiconductor film is preferably used as an electrode.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

FIGS. 1A, 1B, 1C, 1D, and 1E are diagrams showing cross sections of a semiconductor device in the process for forming a polysilicon film on a semiconductor substrate.

Figure 1A:
FIGS. 1A, 1B, 1C, 1D, and 1E are diagrams showing cross sections of a semiconductor device in the process for forming a polysilicon film on a semiconductor substrate.
Figure 1B:
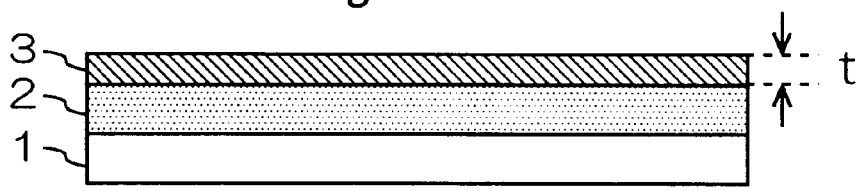

First, as FIG. 1A shows, an oxide film 2 is formed on the upper surface of a semiconductor substrate 1 by heat-treating the semiconductor substrate 1. Next, as FIG. 1B shows, a polysilicon film 3 is deposited on the oxide film 2 using a CVD method or the like. The conditions for depositing the film are determined on the basis of requirements of the semiconductor device to be manufactured.

After the polysilicon film 3 has been formed, the thickness t of the polysilicon film 3 is measured using an optical film thickness measuring apparatus. However, the film thickness t may be measured using other methods.

Figure 1C:
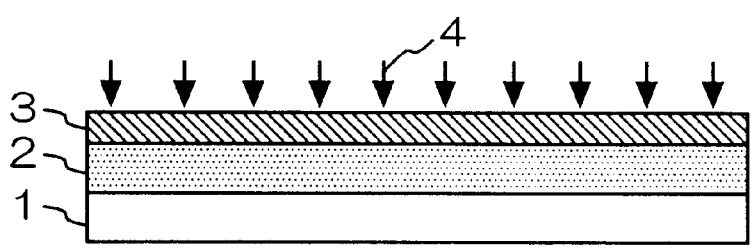

Next, as FIG. 1C shows, an impurity 4 is introduced into the polysilicon film 3 using ion implantation. In this embodiment, $5E16/cm^2$ of arsenic (As) is introduced as the impurity 4.

Figure 1D:
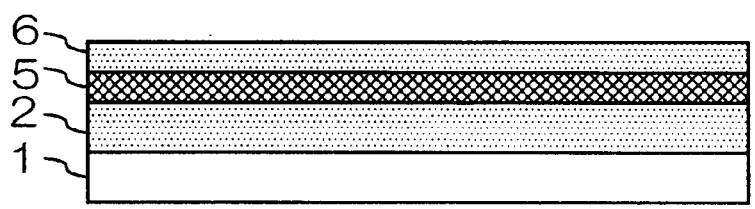
Figure 1E:
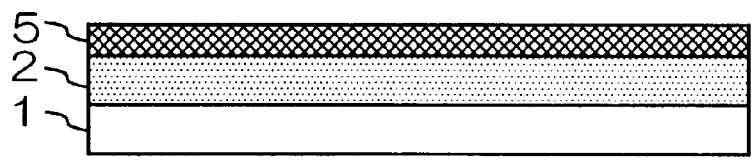

Next, as FIG. 1D shows, an oxide film 6 is deposited on the polysilicon film 5 after introducing the impurity, in order to prevent the sublimation of introduced arsenic. However, if the impurity 4 is a substance that is difficult to sublime, this step may be omitted.

Next, the impurity 4 implanted into the polysilicon film 5 is activated by heat treatment. In this heat treatment, unlike ordinary heat treatment, the temperature and time are controlled so that the impurity 4 is not completely activated. The purpose of this heat treatment is to maintain the number of free carriers produced by activation to a constant number independent from the quantity of the impurity, and that the sheet resistance Rs [Ω/square] of the polysilicon film 5 after introducing the impurity does not depend on the quantity of the impurity. When the impurity 4 is arsenic of 1E16 to $2E16/cm^2$, the conditions of heat treatment can be a temperature of 850° C. for 30 minutes.

Next, the oxide film 6 on the polysilicon film 5 is removed, and the sheet resistance Rs of the exposed polysilicon film 5 is measured using the four-probe method. However the sheet resistance Rs may be measured using other methods.

The quality of the film is controlled by maintaining the product of the sheet resistance Rs and the film thickness t measured after forming the polysilicon film 5 constant. The sheet resistance Rs and the film thickness t are in the relationship of $Rs=\rho/t$, where $\rho$ is the resistivity of the polysilicon film. Therefore, if the manufacturing process is controlled so that Rs×t is always constant, the resistivity $\rho$ of the polysilicon film is maintained constant. As a result, the properties of manufactures semiconductor devices become uniform.

According to the method for manufacturing a semiconductor device of the present invention, semiconductor devices of the same properties can always be obtained by controlling the film quality of the polycrystalline semiconductor film. For example, even if polysilicon films are formed using different polysilicon depositing apparatuses, the properties of manufactured semiconductor devices do not vary depending on polysilicon depositing apparatuses.

It is further understood that the foregoing description is a preferred embodiment of the disclosed apparatus and that various changes and modifications may be made in the invention without departing from the spirit and scope thereof.

The entire disclosure of a Japanese Patent Application No. 2001-268538, filed on Sep. 5, 2001 including specification, claims drawings and summary, on which the Convention priority of the present application is based, are incorporated herein by reference in its entirety.

What is claimed is:

1. A method for manufacturing a semiconductor device comprising:

forming a polysilicon film on a semiconductor substrate;

measuring the thickness of said polysilicon film;

introducing an impurity in said polysilicon film;

activating only a part of said impurity by heat treatment;

measuring the sheet resistance of said polysilicon film after said heat treatment; and adjusting the conditions of forming said polysilicon film so that the product of said film thickness and said sheet resistance becomes a predetermined value.

* * * * *